(12) United States Patent
Jakovlev et al.

(10) Patent No.: US 8,975,669 B2
(45) Date of Patent: Mar. 10, 2015

(54) MICROMECHANICAL SENSOR APPARATUS WITH A MOVABLE GATE, AND CORRESPONDING PRODUCTION PROCESS

(71) Applicant: Robert Bosch GmbH, Stuttgart (DE)

(72) Inventors: Oleg Jakovlev, Stuttgart (DE);
Alexander Buhmann, Reutilngen (DE);
Ando Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 2 days.

(21) Appl. No.: 13/774,052

(22) Filed: Feb. 22, 2013

(65) Prior Publication Data

US 2013/0221411 A1    Aug. 29, 2013

(30) Foreign Application Priority Data

Feb. 23, 2012 (DE) .......... 10 2012 202 783

(51) Int. Cl.
*B81B 3/00* (2006.01)
*B81C 1/00* (2006.01)

(52) U.S. Cl.
CPC ........... *B81B 3/0086* (2013.01); *B81C 1/00698* (2013.01); *B81B 3/0021* (2013.01); *B81B 2201/0292* (2013.01)
USPC ...................... 257/254; 257/E29.324; 438/52

(58) Field of Classification Search
CPC .......................... B81B 3/0062; B81B 81/0086

USPC ........................ 257/254, E29.324; 438/50, 52
See application file for complete search history.

(56) References Cited

U.S. PATENT DOCUMENTS

| | | | | |
|---|---|---|---|---|
| 5,504,356 A | * | 4/1996 | Takeuchi et al. | 257/254 |
| 5,668,033 A | * | 9/1997 | Ohara et al. | 438/113 |
| 5,824,608 A | * | 10/1998 | Gotoh et al. | 438/745 |
| 2008/0042197 A1 | * | 2/2008 | Yamagishi et al. | 257/344 |
| 2010/0276762 A1 | * | 11/2010 | Hayashi et al. | 257/409 |
| 2011/0023632 A1 | * | 2/2011 | Bhat et al. | 73/862.626 |
| 2012/0025277 A1 | * | 2/2012 | Franke | 257/254 |
| 2013/0049112 A1 | * | 2/2013 | Lai et al. | 257/337 |

FOREIGN PATENT DOCUMENTS

DE    44 45 553 A1    6/1995
EP    0 990 911 A1    4/2000

* cited by examiner

*Primary Examiner* — Allan R Wilson
(74) *Attorney, Agent, or Firm* — Maginot, Moore & Beck LLP

(57) ABSTRACT

A micromechanical sensor apparatus has a movable gate and a field effect transistor. The field effect transistor has a drain region, a source region, an intermediate channel region with a first doping type, and a movable gate which is separated from the channel region by an intermediate space. The drain region, the source region, and the channel region are arranged in a substrate. A guard region is provided in the substrate at least on the longitudinal sides of the channel region and has a second doping type which is the same as the first doping type and has a higher doping concentration.

11 Claims, 2 Drawing Sheets

A-A'

MICROMECHANICAL SENSOR APPARATUS WITH A MOVABLE GATE, AND CORRESPONDING PRODUCTION PROCESS

This application claims priority under 35 U.S.C. §119 to patent application no. DE 10 2012 202 783.1, filed on Feb. 23, 2012 in Germany, the disclosure of which is incorporated herein by reference in its entirety.

The disclosure relates to a micromechanical sensor apparatus with a movable gate, and to a corresponding production process.

BACKGROUND

Although any desired micromechanical components can also be used, the present disclosure and the problem on which it is based are explained using silicon-based components.

DE 44 45 553 A1 describes a semiconductor acceleration sensor having a semiconductor substrate, a cantilever structure which is supported by the semiconductor substrate and has a movable electrode, arranged at a predetermined distance above the semiconductor substrate, as well as fixed electrodes which are arranged on the semiconductor substrate. A sensor section is formed by the movable electrode and the fixed electrodes and detects an acceleration by changes in a current between the fixed electrodes, which changes are caused by an offset of the movable electrode associated with the effect of the acceleration on the sensor section.

EP 0 990 911 A1 describes a micromechanical sensor based on the field effect transistor with a movable gate which is movable in a direction parallel to the substrate surface, the movement of the gate in this direction increasing or reducing the channel region overlapped by the gate in at least one MOSFET.

Micromechanical sensor apparatuses with a movable gate usually have evaluation circuits for detecting very small movements, which theoretically have an excellent signal-to-noise ratio and are therefore suitable for use in extremely miniaturized acceleration sensors, for example.

FIG. 3 shows a schematic cross-sectional view for explaining a known micromechanical sensor apparatus with a movable gate in a vertical cross section.

In FIG. 3, reference symbol 2 denotes a silicon substrate in which a drain region 3, a source region 4 and an intermediate channel region 7 of a field effect transistor are provided. A gate insulation layer 5, for example an oxide layer, is provided on the channel region 7. Reference symbol 6 is used to indicate surface charges on the insulation layer 5. A movable gate electrode 1 is movably arranged above the substrate 2 in a manner separated by an intermediate space Z.

The method of operation of such a micromechanical sensor apparatus with a movable gate is as follows: an external force moves the gate electrode 1 in the x,y direction and/or in the z direction. This movement changes the number of charge carriers within the channel region 7 and thus changes the resistance between the drain region 3 and the source region 4. This change in resistance can be detected either by applying a constant voltage and measuring the associated current or by injecting a constant current and measuring the associated voltage change.

A special feature of a sensor apparatus constructed in this manner is the increased noise for displacements in the x,y direction, which noise is observed in real applications. This increased noise can be largely attributed to parasitic leakage currents.

SUMMARY

The disclosure provides a micromechanical sensor apparatus with a movable gate according to the description below and a corresponding production process according to the description below.

Further description below relates to preferred developments.

The idea on which the present disclosure is based lies in the use of an additional guard region at least on the two longitudinal sides of the channel region, which reduce the leakage current in order to minimize the thermal noise. As a result of the guard region, influenced charges remain restricted to the channel region, and an x,y movement of the movable gate results in an optimum change in the channel conductivity. In the case of known sensor apparatuses, parasitic channels are formed in the event of a modulated channel overlap and reduce the sensitivity. As a result of the reduced leakage current according to the present disclosure, the thermal noise of the sensor apparatus is reduced, which improves the signal-to-noise ratio (SNR). This compliance with the SNR then makes it possible either to produce higher-performance sensor apparatuses or to further miniaturize the sensor core.

It is also advantageous if the guard region runs annularly around the drain region, the source region and the channel region in the substrate. This measure results in easier production or processing with lower tolerance requirements on well placement.

It is also advantageous if the channel region is covered by at least one gate insulation layer. This achieves a better surface property and thus lower scattering of channel parameters as a result of the oxide used. Furthermore, this measure results in lower sensitivity to environmental and ambient properties (for example moisture, particle loading, etc.).

It is also advantageous if the movable gate is produced from polysilicon. This measure reduces the production costs, thus making it possible to use surface micromachining.

It is also advantageous if the guard region has an external voltage connection. This makes it possible to define the potential of a well and to additionally reduce the leakage current further by applying a suitable voltage.

BRIEF DESCRIPTION OF THE DRAWINGS

Further features and advantages of the present disclosure are explained below using embodiments with reference to the figures, in which.

DETAILED DESCRIPTION

In the figures, identical reference symbols denote identical or functionally identical elements.

Figure 1A:
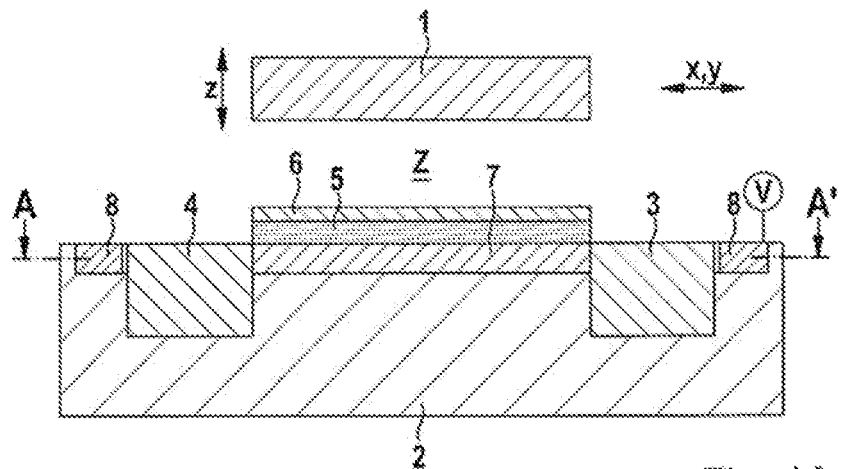
FIGS. 1a), b) show schematic cross-sectional views for explaining a micromechanical sensor apparatus with a movable gate and a corresponding production process according to one embodiment of the present disclosure, to be precise in a vertical cross section in FIG. 1a) and, in FIG. 1b), in a horizontal cross section along the line A-A' in FIG. 1a)
Figure 1B:
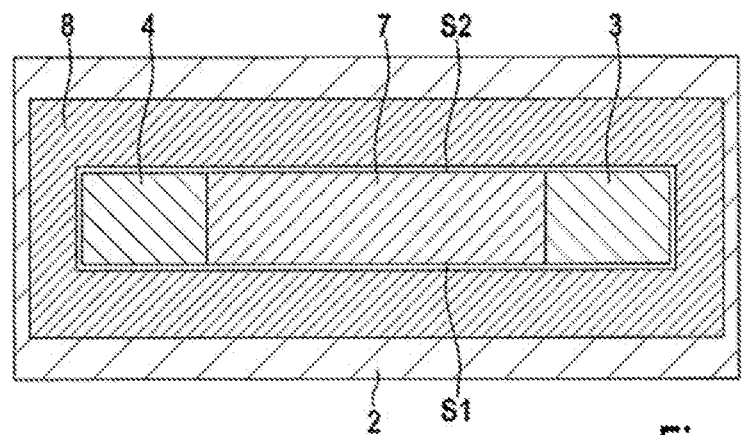

FIGS. 1a), b) are schematic cross-sectional views for explaining a micromechanical sensor apparatus with a movable gate and a corresponding production process according to one embodiment of the present disclosure, to be precise in a vertical cross section in FIG. 1a) and, in FIG. 1b), in a horizontal cross section along the line A-A' in FIG. 1a).

In FIGS. 1a), b), reference symbol 2 denotes a silicon substrate in which a drain region 3, a source region 4 and an intermediate channel region 7 of a field effect transistor are provided. A gate insulation layer 5, for example an oxide layer, is provided on the channel region 7. Reference symbol 6 is used to indicate surface charges on the insulation layer 5. A movable gate electrode 1 is movably arranged above the substrate 2 in a manner separated by an intermediate space Z.

Figure 3:
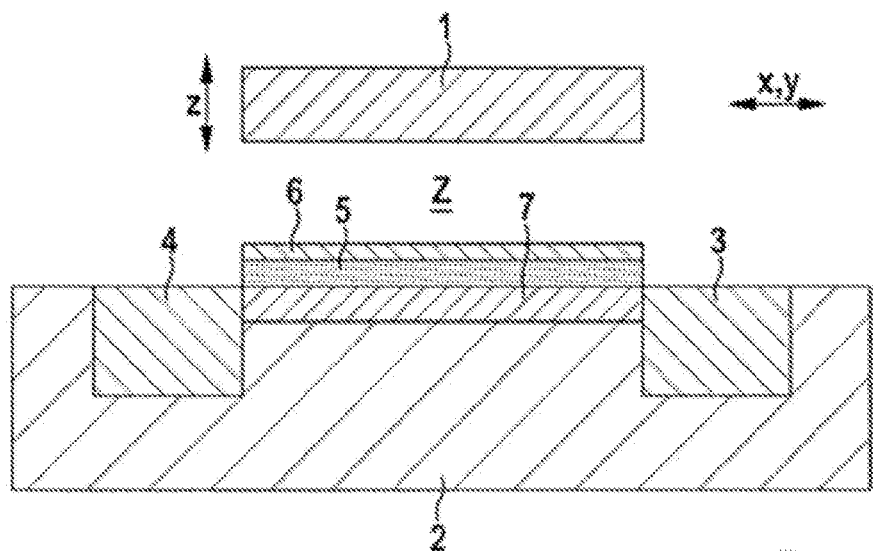
FIG. 3 shows a schematic cross-sectional view for explaining a known micromechanical sensor apparatus with a movable gate in a vertical cross section.

In contrast to the above-described known micromechanical sensor apparatus according to FIG. 3, the present embodiment of the disclosure has a guard region 8 which is provided in the substrate 2 and runs annularly around the drain region 3, the source region 4 and around the channel region 7 along the longitudinal sides S1, S2 of the latter in the substrate. The guard region 8 has a doping type, for example p+/p++, which is the same as a doping type of the channel region 7, for example p-type doping, but has a higher doping concentration. In the embodiment illustrated, the depth of the guard region 8 is substantially the same depth as that of the channel region 7. However, this may be varied in an application-specific manner.

When a voltage above the threshold voltage is applied to the movable gate 1, this forms a conductive channel region 7. If the drain region 3 and the source region 4 now have a potential difference, a measurable current flows between the two regions. Since the electric field of the gate 1 not only has a local effect on the geometrical region of the channel region but also outside the channel region, this forms said parasitic leakage currents in known micromechanical sensor apparatuses.

The guard region 8 according to the disclosure, a guard ring here, increases the threshold voltage or displaces charge carriers, which have an identical polarization to the charge carriers in the channel region 7, outside the geometrically defined channel region. This is effected by virtue of the fact that the guard region 8 is doped to a correspondingly high degree with charge carriers which are the same as the charge carriers in the channel region 7. For example, the guard region 8 will be doped with n+/n++ charge carriers in the case of an n-doped channel region 7 and will be doped with p+/p++ charge carriers in the case of a p-doped channel region 7.

Optionally, the guard ring 8 may have an external voltage connection V and can therefore be set to a fixed potential by means of electrical contact-making. In particular, it is also conceivable for the channel region 7 to be constricted during sensor operation by an appropriate bias at the voltage connection V at the guard region 8. This achieves a field concentration in the channel region 7 and therefore again increases the sensitivity in the event of small lateral movements of the gate 1.

Figure 2:
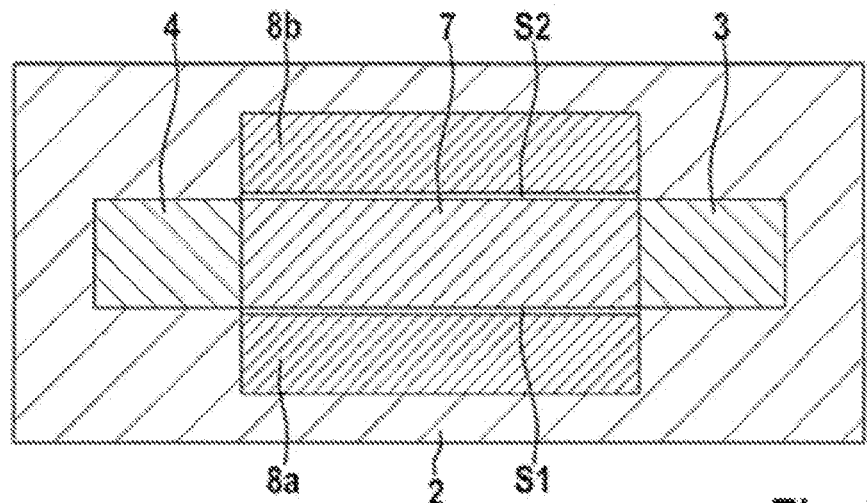
FIG. 2 shows a schematic cross-sectional view for explaining a micromechanical sensor apparatus with a movable gate and a corresponding production process according to another embodiment of the present disclosure in a horizontal cross section similar to FIG. 1b)

FIG. 2 is a schematic cross-sectional view for explaining a micromechanical sensor apparatus with a movable gate and a corresponding production process according to another embodiment of the present disclosure in a horizontal cross section similar to FIG. 1b).

In the second embodiment, the guard region 8a, 8b is not provided as an annular region, like in the first embodiment, but rather has two strip regions 8a, 8b in the substrate 2 which are arranged parallel to the longitudinal sides S1 and S2 of the channel region 7 and have approximately the same length as the channel region 7.

Otherwise, the structure of the second embodiment is identical to the structure of the first embodiment described above.

The disclosure can be used in a particularly advantageous manner for compact and cost-effective, highly sensitive and robust MEMS sensors, for example inertial sensors, pressure sensors, imagers, microphones, micromechanical switches etc.

Although the present disclosure was described using preferred exemplary embodiments, it is not restricted thereto. In particular, the materials and topologies mentioned are only exemplary and are not restricted to the examples explained.

What is claimed is:

1. A process for producing a micromechanical sensor apparatus with a movable gate, the process comprising:
    forming a field effect transistor with a drain region, a source region, an intermediate channel region with a first doping type, and a movable gate which is separated from the channel region by an intermediate space, wherein the drain region, the source region and the channel region are arranged in a substrate; and
    producing a guard region in the substrate immediately adjacent the longitudinal sides of the channel region that has a second doping type which is the same as the first doping type and has a higher doping concentration.

2. The process according to claim 1, wherein the step of producing the guard region including configuring the guard region to run annularly around the drain region, the source region and the channel region in the substrate.

3. The process according to claim 1, further comprising covering the channel region by at least one gate insulation layer.

4. The process according to claim 1, wherein the movable gate is formed of polysilicon.

5. The process according to claim 1, wherein the step of producing the guard region includes providing the guard region with an external voltage connection.

6. The process according to claim 1, wherein producing the guard region includes producing the guard region by one of a diffusion process and an implantation process using a corresponding mask.

7. A micromechanical sensor apparatus with a movable gate, the micromechanical sensor apparatus comprising:
    a field effect transistor with a drain region, a source region, an intermediate channel region with a first doping type, and a movable gate which is separated from the channel region by an intermediate space, wherein the drain region, the source region and the channel region are arranged in a substrate; and
    a guard region provided in the substrate and immediately adjacent to longitudinal sides of the channel region, the guard region having a second doping type which is the same as the first doping type and has a higher doping concentration than the first doping type.

8. The micromechanical sensor apparatus according to claim claim 7, wherein the guard region is configured to run annularly around the drain region, the source region and the channel region in the substrate.

9. The micromechanical sensor apparatus according to claim 7, wherein the channel region is covered by at least one gate insulation layer.

10. The micromechanical sensor apparatus according to claim 7, wherein the movable gate is polysilicon.

11. The micromechanical sensor apparatus according to claim 7, wherein the guard region has an external voltage connection.

* * * * *